US012732178B2

(12) United States Patent
Li

(10) Patent No.: US 12,732,178 B2
(45) Date of Patent: Sep. 8, 2026

(54) DYNAMIC OFFSET CALIBRATION CIRCUIT AND METHOD FOR OPERATING THE SAME

(71) Applicant: TAIWAN SEMICONDUCTOR MANUFACTURING COMPANY LTD., Hsinchu (TW)

(72) Inventor: Chang-Yi Li, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/910,056

(22) Filed: Oct. 9, 2024

(65) Prior Publication Data

US 2026/0100701 A1 Apr. 9, 2026

(51) Int. Cl.

*H03K 5/156* (2006.01)
*H03K 3/01* (2006.01)
*H03K 3/017* (2006.01)

(52) U.S. Cl.

CPC ............. *H03K 5/1565* (2013.01); *H03K 3/01* (2013.01); *H03K 3/017* (2013.01)

(58) Field of Classification Search

CPC .......... H03K 5/156; H03K 3/017; H03K 5/04; H03K 5/1565; H03K 7/08; H03K 5/05

See application file for complete search history.

(56) References Cited

U.S. PATENT DOCUMENTS

2023/0090369 A1 * 3/2023 Familia .................... H04L 7/02

OTHER PUBLICATIONS

Wen Guanguo, Long Qiang, Hu Huiyong, and Zhang Jincheng, "An Auto Offset Calibration Method for High-resolution Continuous CMOS Comparators", Sensors and Materials, vol. 35, No. 7, 2023, p. 2653-2668.

* cited by examiner

*Primary Examiner* — Jung Kim

(74) *Attorney, Agent, or Firm* — WPAT LAW; Anthony King

(57) ABSTRACT

An integrated circuit includes a first corrector circuit and a second corrector circuit. The first corrector circuit calibrates a first duty cycle of a first clock signal based on an offset calibration code to generate a first output clock signal. The second corrector circuit calibrate a second duty cycle of a second clock signal based on the offset calibration code to generate a second output clock signal. A first trim code includes a first upper portion and a first lower portion, and a second trim code includes a second upper portion and a second lower portion. A first portion of the offset calibration code is an average of the first upper portion and the second upper portion, and a second portion of the offset calibration code is an average of the first lower portion and the second lower portion.

20 Claims, 9 Drawing Sheets

DYNAMIC OFFSET CALIBRATION CIRCUIT AND METHOD FOR OPERATING THE SAME

BACKGROUND

In the field of electronic circuits, duty cycle correctors are widely recognized for their role in ensuring the accuracy of signal timing. These devices are commonly used to adjust the duty cycle of a periodic signal, which is the ratio of the signal's high time to its total period. Accurate duty cycle correction is needed in various applications, including clock generation, data communication, and signal processing. Various designs and methodologies have been developed to enhance the performance and reliability of these correctors. These include analog and digital approaches, each with its own set of advantages and limitations. The ongoing development in this area aims to improve the precision, efficiency, and integration of duty cycle correctors in modern electronic systems.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1:
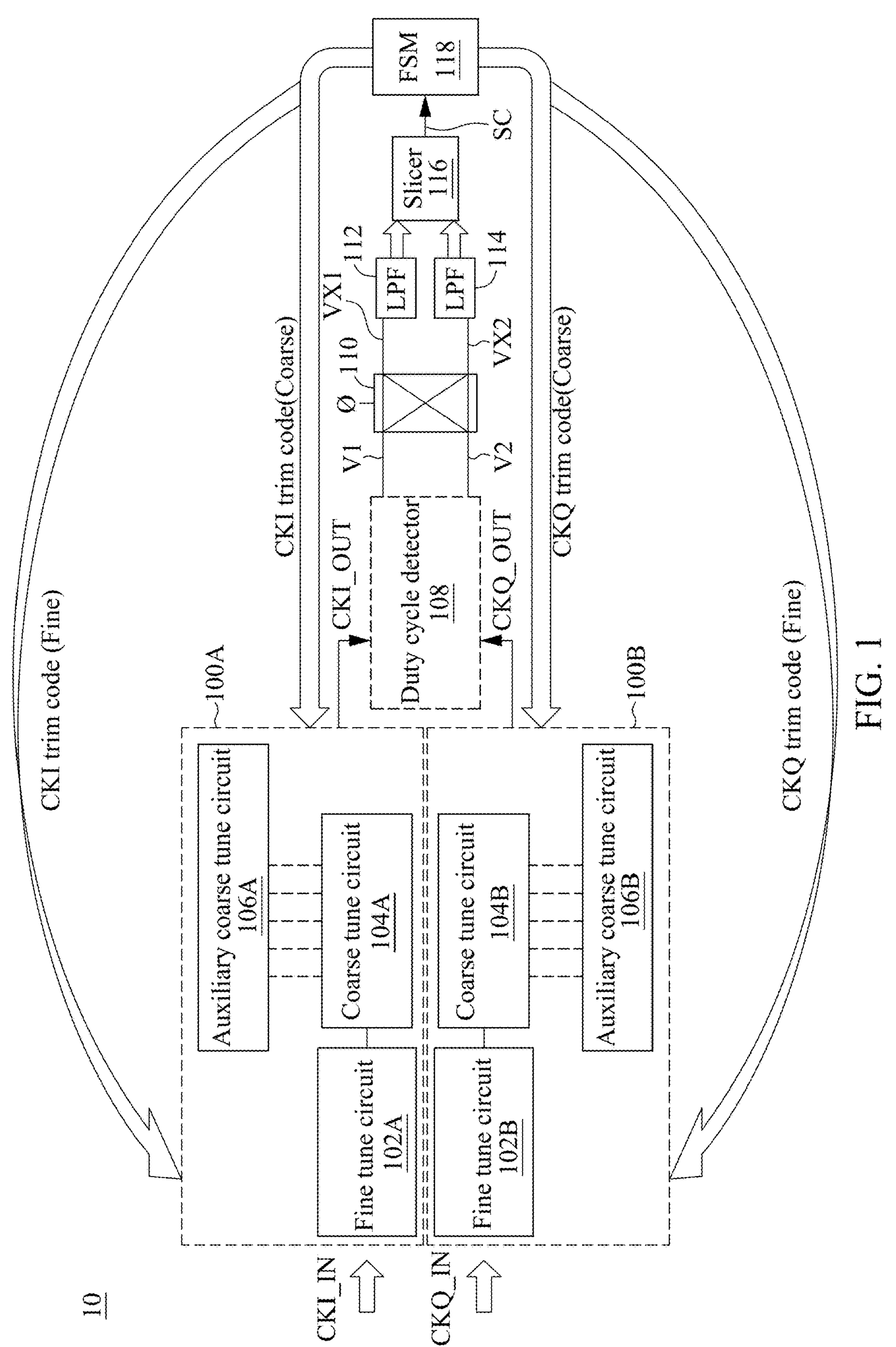
FIG. 1 is a block diagram of a dynamic offset calibration system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In some embodiments, a dynamic offset calibration system is provided, which includes a first corrector circuit and a second corrector circuit. The first corrector circuit is configured to calibrate a first duty cycle of a first clock signal to generate a first output clock signal, and the second corrector circuit is configured to calibrate a second duty cycle of a second clock signal to generate a second output clock signal. The first clock signal and the second clock signal have a phase difference of 90 degrees. An offset calibration code is obtained from a first trim code and a second trim code corresponding to a first edge condition of the first duty cycle and a second edge condition of the second duty cycle. The offset calibration code is provided to the first corrector circuit and the second corrector circuit to cancel offsets between the duty cycles of the first output clock signal and the second output clock signal.

FIG. 1 is a block diagram of a dynamic offset calibration system in accordance with some embodiments of the present disclosure.

In some embodiments, the dynamic offset calibration system 10 may be an integrated circuit configured to receive input clock signals CKI_IN and CKQ_IN and generate output clock signals CKI_OUT and CKQ_OUT based on the input clock signals CKI_IN and CKQ_IN with an auto-zeroed duty cycle, thereby achieving wide range tuning of duty cycles of the output clock signals CKI_OUT and CKQ_OUT using a predetermined output trim code. The dynamic offset calibration system 10 includes fine tune circuits 102A-102B, coarse tune circuits 104A-104B, auxiliary coarse tune circuit 106A-106B, a duty cycle detector 108, a chopper 110, low-pass filters (LPF) 112 and 114, a slicer 116, and a finite state machine (FSM) 118.

In some embodiments, the input clock signal CKI_IN is an in-phase clock signal, while the input clock signal CKQ_IN is a quadrature phase clock signal having the same operating frequency as the input clock signal CKI_IN. The input clock signals CKI_IN and CKQ_IN may be generated by a clock generator (e.g., a phase locked loop (PLL) circuit or a delay-locked loop (DLL) circuit), which can be external to or integrated into the dynamic offset calibration system 10. In some embodiments, the input clock signals CKI_IN and CKQ_IN generated by the clock generator can have a 90-degree phase difference. However, due to process variations and different delays of components within the dynamic offset calibration system 10, the output clock signals CKI_OUT and CKQ_OUT generated by the first corrector circuit 100A and the second corrector circuit 100B may have different duty cycles.

In some embodiments, the fine tune circuit 102A, coarse tune circuit 104A, and auxiliary coarse tune circuit 106A can be regarded as a first corrector circuit 100A (e.g., a first corrector), while the fine tune circuit 102B, coarse tune circuit 104B, and auxiliary coarse tune circuit 106B can be regarded as a second corrector circuit 100B (e.g., a second corrector). Specifically, the first corrector circuit 100A may be configured to adjust the duty cycle and/or phase of the output clock signal CKI_OUT based on a first portion (e.g. coarse tune code) and a second portion (e.g., fine tune code) of the first trim code (e.g., CKI trim code or "code1") generated by the finite state machine 118. The second corrector circuit 100B may be configured to adjust the duty cycle and/or phase of the output clock signal CKQ_OUT based on a first portion (e.g. coarse tune code) and a second portion (e.g., fine tune code) of the second trim code (e.g., CKQ trim code or "code2") generated by the finite state machine 118.

For purposes of description, the first trim code is a 64-bit trim code EN[0:63], where EN[0] denotes the most significant bit (MSB), and EN[63] denotes the least significant bit (LSB). In some embodiments, the first portion and the second portion of the first trim code can be regarded as a fine tune code and a coarse tune code. For example, the fine tune code may be the least significant portion of the first trim code EN[0:63], such as EN[8:63], while the coarse tune code may be the most significant portion of the first trim code EN[0:63], such as EN[0:7]. In some embodiments, the auxiliary coarse tune circuit 106A may receive the coarse tune code for auxiliary coarse tuning of the input clock signal CKI_IN, the details of which will be described later. It should be noted that the numbers of bits within the first portion and the second portion of the first trim code can be adjusted according to practical needs.

Figure 3:
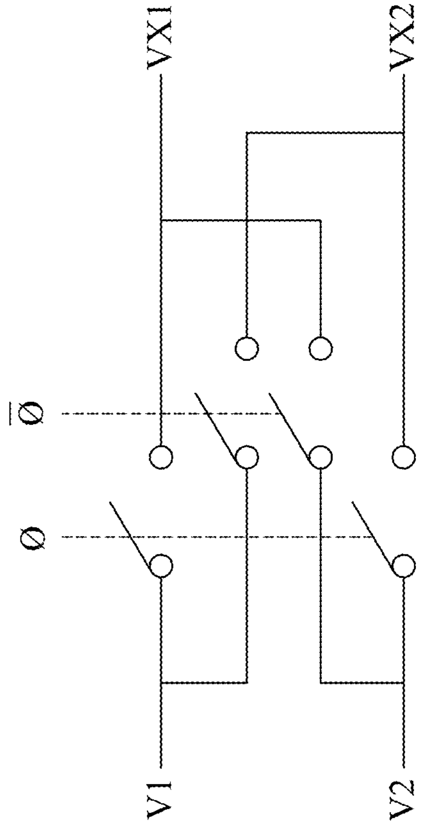
FIG. 3 is a schematic diagram of a chopper in accordance with some embodiments of the present disclosure.

In some embodiments, the duty cycle detector 108 is also regarded as a phase detector, and configured to detect duty cycles of the output clock signals CKI_OUT and CKQ_OUT generated by the first corrector circuit 100A and the second corrector circuit 100B to generate a first voltage signal V1 and a second voltage signal V2, respectively. In some embodiments, the first voltage signal V1 and the second voltage signal V2 are fed to the chopper 110 to generate a first chopped signal VX1 and a second chopped signal VX2, respectively, as depicted in FIG. 3, which illustrates a schematic diagram of the chopper 110. The control signals $\Phi$ and $\overline{\Phi}$ can be used to control the chopper 110 to enter a bypass mode or a swap mode. When the chopper 110 is in the bypass mode (e.g., Φ=1 and Φ=0), the first voltage signal V1 and the second voltage signal V2 may pass through the chopper 110 to generate a first chopped voltage signal VX1 and a second chopped voltage signal VX2, which serve as inputs of the low-pass filters 112 and 114. When the chopper 110 is in the swap mode (e.g., Φ=0 and Φ=1), the chopper 110 is configured to swap the first voltage signal V1 and the second voltage signal V2. Thus, the second voltage signal V2 and the first voltage signal V1 passes through the chopper to generate the first chopped voltage signal VX1 and the second chopped voltage signal VX2, which serve as inputs of the low-pass filters 112 and 114. The low-pass filters 112 and 114 may filter its inputs to generate a first filtered signal and a second filtered signal, respectively, which are provided to the slicer 116. The slicer 116 may function as a comparator configured to compare the first filtered signal and the second filtered signal to generate an output signal SC (e.g., a comparison result), and the finite state machine 118 may generate a first trim code (e.g., code1) or a second trim code (e.g., code2) based on the slicer 116's output signal SC, and transmit the first trim code or the second trim code back to the first corrector circuit 100A or the second corrector circuit 100B for adjusting the duty cycle (or phase) of the output clock signal CKI_OUT or CKQ_OUT for auto zeroing. It should be noted that auto-zeroing the offsets of both the duty cycle detector 108 and slicer 116 can be performed concurrently.

In some embodiments, the finite state machine 118 includes a plurality of operating states, each being represented by a respective trim code. In other words, when the finite state machine 118 changes its operating state during the calibration procedure, the trim code generated by the finite state machine 118 also changes correspondingly.

In some embodiments, the tuning mechanism of the duty cycle and phase of the output clock signals CKI_OUT and CKQ_OUT can cover a wide range of frequencies in a piecewise curve with high linearity for auto-calibrating. For example, the number of bits within the coarse tune code (e.g., EN[0:7]) can represent the number of piecewise linear curves used for calibrating the duty cycle of the output clock signals CKI_OUT and CKQ_OUT. The number of bits within the fine tune code (e.g., EN[8:63]) can represent the number of steps on each piecewise linear curve for calibrating the duty cycle of the output clock signals CKI_OUT and CKQ_OUT. In some embodiments, the coarse tune code and the fine tune code are represented using thermal meter codes. For example, a coarse tune code of 2 indicates that EN[0:1]=2'b11 and the remaining portion EN[2:7]=6'b0. A fine tune code of 5 indicates that EN[8:12]=5'b11111 and the remaining portion EN[13:63]=51'b0.

Figure 2:
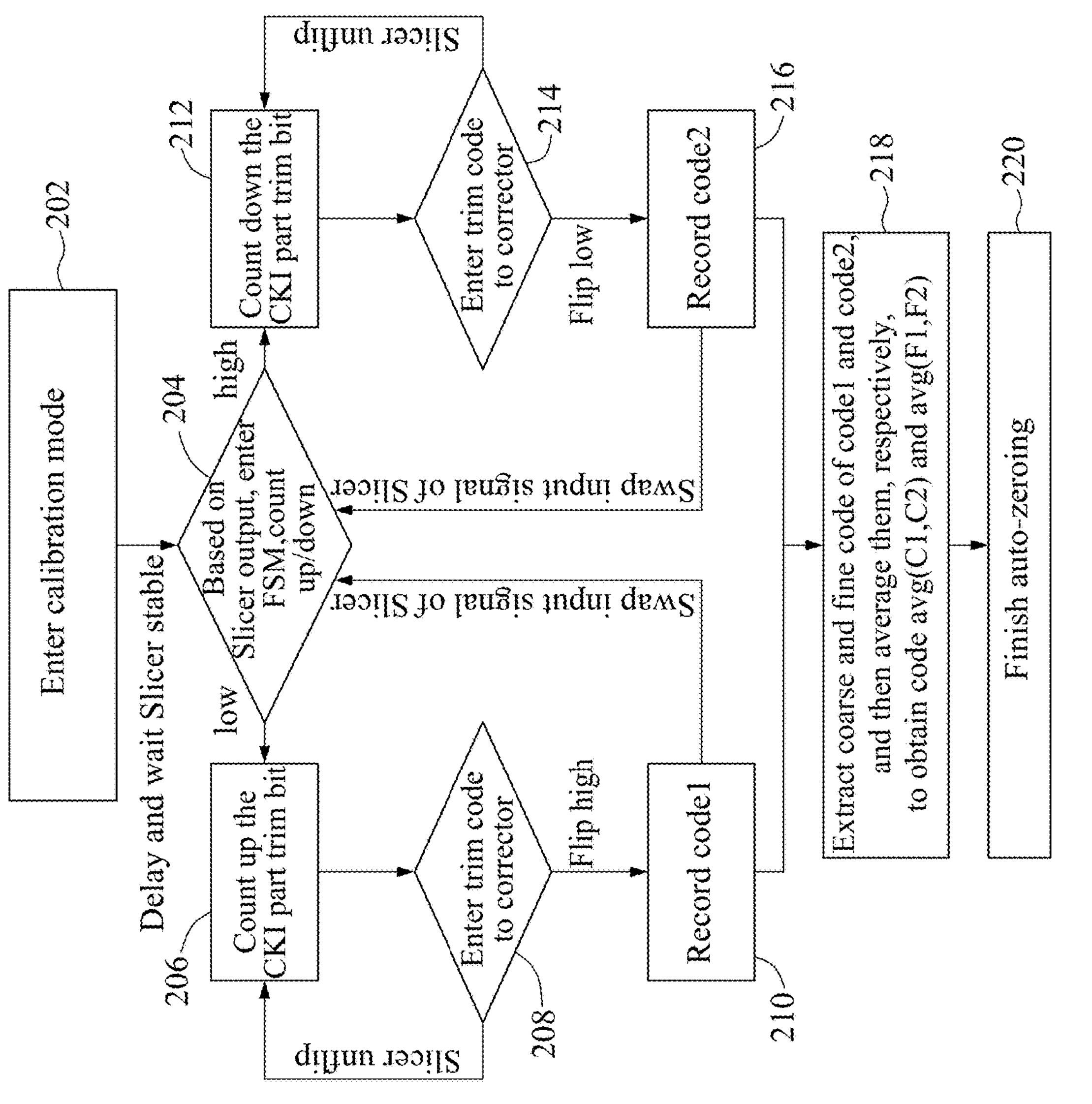
FIG. 2 is a flowchart of an auto offset calibration method in accordance with some embodiments of the present disclosure.

FIG. 2 is a flowchart of an auto offset calibration method in accordance with some embodiments of the present disclosure. Please refer to both FIG. 1 and FIG. 2.

The auto offset calibration method 200 shown in FIG. 2 includes operation 202 to 220. At operation 202, the dynamic offset calibration system 10 enters a calibration mode. In some embodiments, when the dynamic offset calibration system 10 is powered up, the dynamic offset calibration system 10 receives input clocks signals CKI_IN and CKQ_IN, and enters the calibration mode. During the calibration mode, the dynamic offset calibration system 10 is configured to generate a trim code for calibrating the duty cycle and/or phase of the output clock signal CKI_OUT, thereby maintaining a 90-degree difference between the output clock signals CKI_OUT and CKQ_OUT. After a certain delay to wait for the slicer 116 to be stable, operation 204 is performed. It should be noted that while performing calibration of the first trim code (e.g., "code1"), the first chopped voltage signal VX1 and the second chopped voltage signal VX2 generated by the chopper 110 equal the first voltage signal V1 and the second voltage signal V2, respectively.

At operation 204, based on the slicer 116's output, enter the finite state machine 118 to count up or down. In some embodiments, the slicer 116 may compare the first filtered signal and the second filtered signal generated by the low-pass filters 112 and 114 to generate an output signal. In response to the slicer 116's output being in the high logic state, operation 212 is performed. In response to the slicer 116's output being in the low logic state, operation 206 is performed.

At operation 206, count up the CKI part trim bit. For example, when the slicer 116's output being in the low logic state, it indicates that the duty cycle of the output clock signal CKI_OUT is shorter than that of the output clock signal CKQ_OUT, and operation 206 is performed to count up the CKI part trim bit.

At operation 208, enter trim code to the first corrector circuit 100A (i.e., "corrector" in short). In some embodiments, when the CKI part trim bit entered to the duty cycle corrector counts up, the duty cycle of the output clock signal CKI_OUT increases. When the output of the slicer 116 is unflipped, it indicates that the duty cycle of the output clock signal CKI_OUT is still shorter than that of the output clock signal CKQ_OUT, and the flow goes back to operation 206 to count up the CKI part trim bit again. The loop of operations 206 and 208 can be performed repeatedly until the output of the slicer 116 flips from the low logic state to the high logic state (i.e., flip high), and then operation 210 is performed.

At operation 210, record code1. In some embodiments, when the output of the slicer 116 flips from the low logic state to the high logic state, it indicates that the duty cycle of the output clock signal CKI_OUT is slightly longer than, but very close to, that of the output clock signal CKQ_OUT. Accordingly, the trim code used by the first corrector circuit 100A at this time is recorded as "code1", which can be regarded as an edge condition of the trim code. After code1 is recorded, the input signals of the slicer 116 is swapped by chopper 110 to enter calibration of the second trim code (e.g., "code2"). For example, while performing calibration of the second trim code (e.g., "code2"), the first chopped voltage signal VX1 and the second chopped voltage signal VX2 generated by the chopper 110 are equal to the second voltage signal V2 and the first voltage signal V1, respectively.

At operation 212, count down the CKI part trim bit. Here, for purposes of description, the trim code for calibrating the phase and duty cycle of the output clock signal CKQ_OUT is regarded as the CKI part trim bit. Since the first voltage signal V1 and the second voltage signal V2 are swapped by the chopper 110, when the slicer 116's output being in the high logic state, it indicates that the duty cycle of the output clock signal CKQ_OUT is longer than that of the output clock signal CKI_OUT, and operation 212 is performed to count down the CKI part trim bit.

At operation 214, enter trim code to the second corrector circuit 100B (i.e., "corrector" in short). In some embodiments, when the CKI part trim bit entered to the second corrector circuit 100B is counted down, the duty cycle of the output clock signal CKQ_OUT decreases. When the output of the slicer 116 is unflipped, it indicates that the duty cycle of the output clock signal CKQ_OUT is still longer than that of the output clock signal CKI_OUT, and the flow goes back to operation 212 to count down the CKI part trim bit again. The loop of operations 212 and 214 can be performed repeatedly until the output of the slicer 116 flips from the high logic state to the low logic state (i.e., flip low), and then operation 216 is performed.

At operation 216, record code2. In some embodiments, when the output of the slicer 116 flips from the high logic state to the low logic state, it indicates that the duty cycle of the output clock signal CKQ_OUT is slightly shorter than, but very close to, that of the output clock signal CKI_OUT. Accordingly, the trim code used by the second corrector circuit 100B at this time is recorded as "code2", which can be regarded as another edge condition of the trim code.

At operation 218, extract coarse and fine tune codes of code1 and code2, and then average them, respectively, to get an average coarse tune code and an average fine tune code. For example, code1 and code2 can be expressed as (C1, F1) and (C2, F2), respectively. C1 and C2 denote the coarse tune codes (e.g., most significant bits) of code1 and code2, while F1 and F2 denote the fine tune codes (e.g., least significant bits) of code1 and code2, respectively. Additionally, the averaging of the code1 and code2 are performed on the coarse tune codes (e.g., C1 and C2) and fine tune codes (e.g., F1 and F2) separately, thereby obtaining a correct average code for piecewise linear curves representing the relationship between the trim code and the duty cycle of the output clock signal. Accordingly, the average coarse tune code and the average fine tune code can be expressed as avg(C1,C2) =(C1+C2)/2 and avg(F1, F2)=(F1+F2)/2, respectively.

At operation 220, finish auto-zeroing. In some embodiments, due to process variations and different component delays within the dynamic offset calibration system 10, there may be offset between the duty cycles of the output clocks signal CKI_OUT or CKQ_OUT. The auto offset calibration method 200 shown in FIG. 2 is capable of searching for trim codes for the edge operating conditions of the dynamic offset calibration system 10. Accordingly, by designating appropriate trim codes for the first corrector circuit 100A and second corrector circuit 100B, the offset between duty cycles of the output clock signals CKI_OUT and CKQ_OUT generated by the first corrector circuit 100A and second corrector circuit 100B can be canceled, thereby achieving auto-zeroing of the dynamic offset calibration system 10. Additionally, the dynamic offset calibration system can cover a wide range of frequencies for duty cycle tuning and phase tuning of the output clock signals using piecewise linear curves, and obtain a precise average trim code without an average error.

Figure 4:
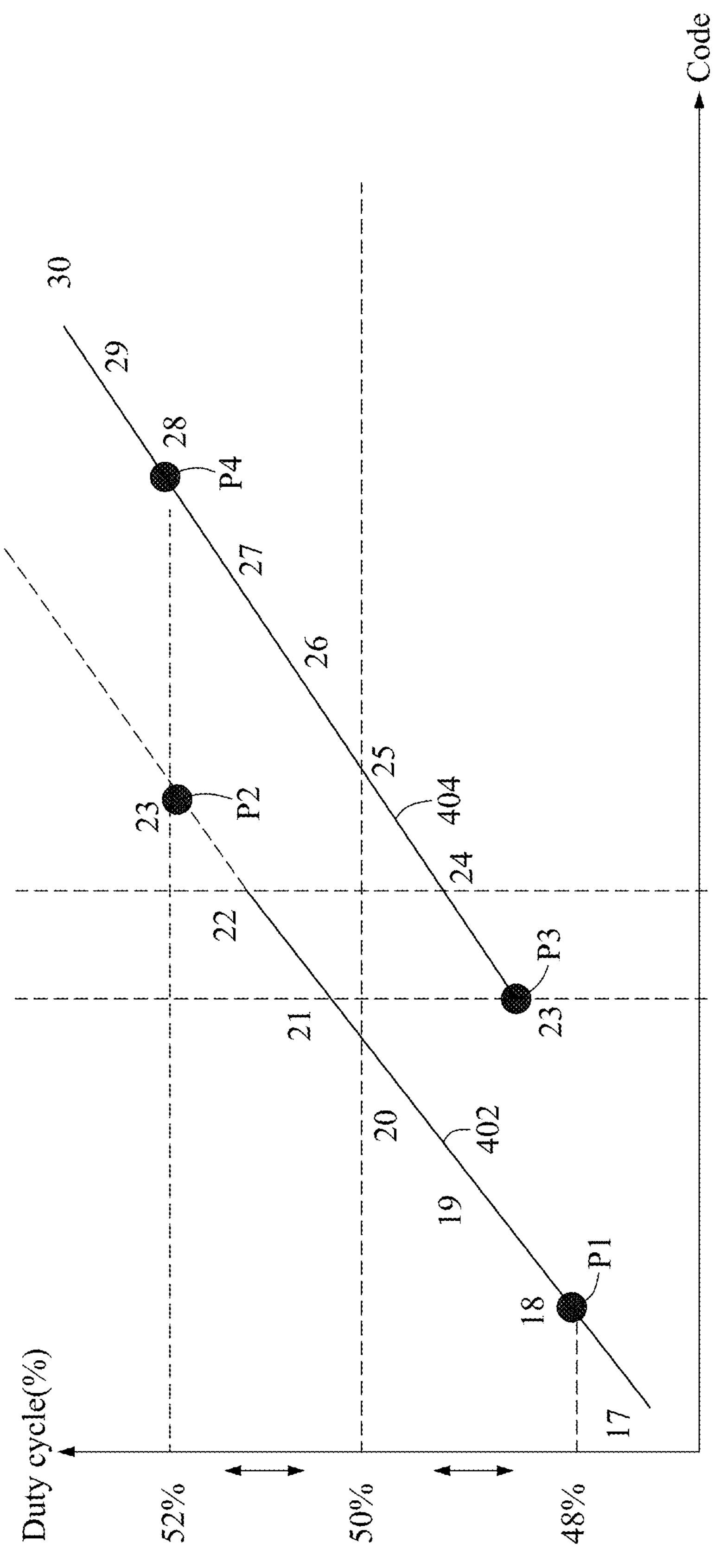
FIG. 4 is a diagram illustrating piecewise linear curves using separated average fine tune codes and average coarse tune codes in accordance with some embodiments of the present disclosure.

FIG. 4 is a diagram illustrating piecewise linear curves using separated average fine tune codes and average coarse tune codes in accordance with some embodiments of the present disclosure.

In some embodiments, curves 402 and 404 are piecewise linear curves representing different tuning ranges. For example, when the trim code is between 17 and 23, curve 402 may be monotonically linear for adjusting the duty cycle of the output clock signal CKI_OUT (or CKQ_OUT), where the trim codes of points P1 and P2 are 18 and 23 which correspond to duty cycles of 48% and 52%, respectively.

When the trim code is between 23 and 30, curve 404 may be monotonically linear for adjusting the duty cycle of the output clock signal CKI_OUT (or CKQ_OUT), where the trim codes of points P3 and P4 are 23 and 28 which correspond to duty cycles 48% and 52%, respectively. Considering curve 402, when code1 and code2 obtained using calibration method 200 described above is 23 and 18, respectively, the average code of code1 and code2 would be (23+18)/2=20.5 without classifying fine tune codes and coarse tune codes. This average code is valid for curve 402 since code1, code2, and the average code are located on curve 402, which is a local piecewise linear curve, and the finite state machine 118 is capable of generating feedback trim codes to the first corrector circuit 100A and the second corrector circuit 100B.

It should be noted that part of curve 404 overlaps with curve 402, and curves 404 and 402 are different piecewise linear curves with different trim code ranges and duty cycle ranges. In an example where code1=28 and code2=18, the average code of code1 and code2 would be (28+18)/2=23 without using fine tune codes and coarse tune codes of code1 and code2, indicating that point P3 represents an average code with error. This average code is invalid for curves 402 and 404 since code1, code2, and the average code are not located on the same piecewise linear curve. In this situation, the finite state machine 118 could generate erroneous trim codes for the first corrector circuit 100A and the second corrector circuit 100B.

As described in the embodiment of FIG. 2, code1 and code2 can be expressed as (C1, F1) and (C2, F2), respectively. C1 and C2 denote the coarse tune codes (e.g., most significant bits) of code1 and code2, while F1 and F2 denote the fine tune codes (e.g., least significant bits) of code1 and code2, respectively. Additionally, the averaging of the code1 and code2 are performed on the coarse tune codes (e.g., C1 and C2) and fine tune codes (e.g., F1 and F2) separately, thereby obtaining a correct average code for piecewise linear curves representing the relationship between the trim code and the duty cycle of the output clock signal. Accordingly, the average coarse tune code and the average fine tune code can be expressed as avg(C1,C2)=(C1+C2)/2 and avg(F1, F2)=(F1+F2)/2, respectively. Furthermore, the average fine tune code avg(F1, F2) can be sent to the fine tune circuits 102A and 102B, while the average coarse tune code avg(C1, C2) can be sent to the coarse tune circuits 104A and 104B and auxiliary coarse tune circuits 106A and 106B, allowing the dynamic offset calibration system 10 to perform with substantially zero offset.

Figure 5:
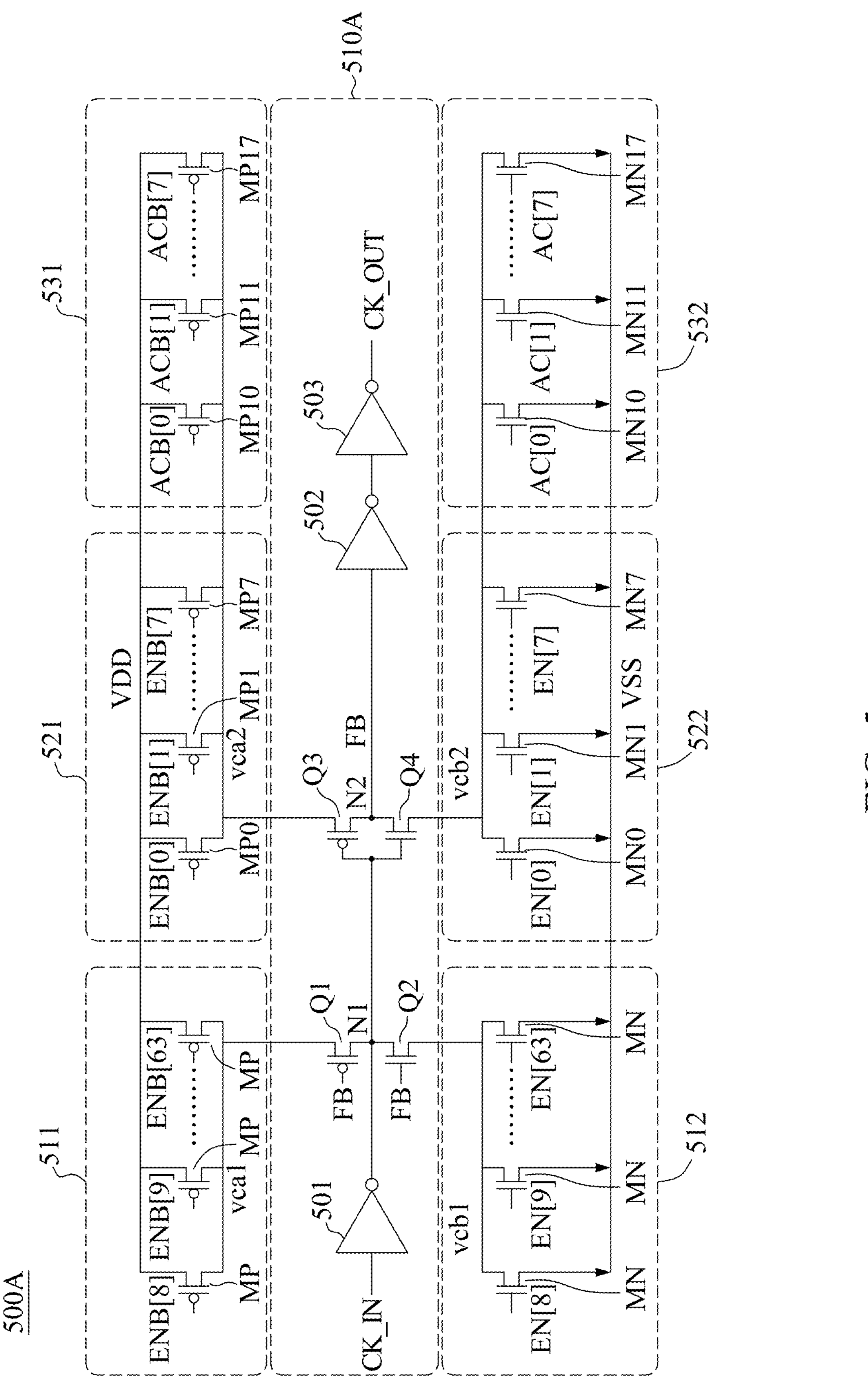
FIG. 5 is a schematic diagram of a corrector circuit in accordance with some embodiments of the present disclosure.
Figure 6:
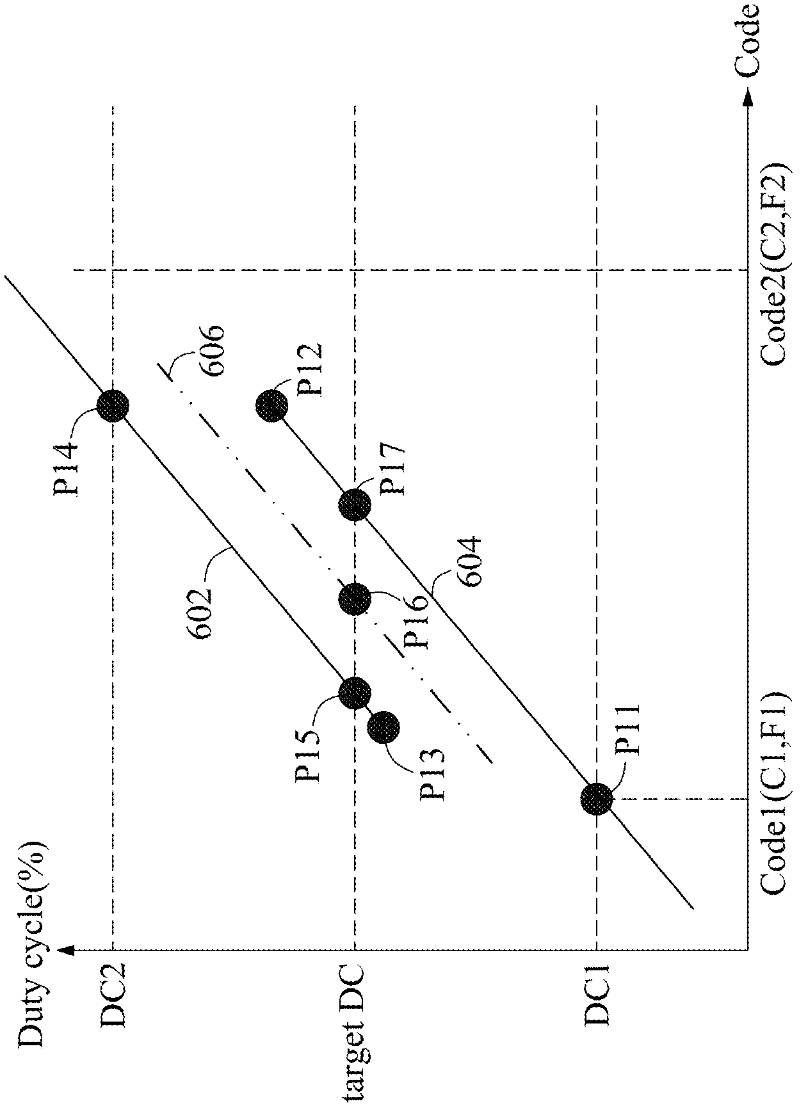
FIG. 6 is a diagram illustrating piecewise linear curves and an auxiliary piecewise linear curve in accordance with the embodiment of FIG. 5.

FIG. 5 is a schematic diagram of a corrector circuit in accordance with some embodiments of the present disclosure. FIG. 6 is a diagram illustrating piecewise linear curves and an auxiliary piecewise linear curve in accordance with the embodiment of FIG. 5.

In some embodiments, the first corrector circuit 100A and the second corrector circuit 100B shown in FIG. 1 can be implemented using the corrector circuit 500A shown in FIG. 5. When the input clock signal CK_IN refers to the in-phase clock signal CKI_IN, the output clock signal CK_OUT refers to the in-phase output clock signal CKI_OUT. Similarly, when the input clock signal CK_IN refers to the quadrature clock signal CKQ_IN, the output clock signal CK_OUT refers to the quadrature output clock signal CKQ_OUT.

In some embodiments, the corrector circuit 500A shown in FIG. 5 includes a driving circuit 510A, fine tune circuits 511 and 512, coarse tune circuits 521 and 522, and auxiliary coarse tune circuits 531 and 532, as depicted in FIG. 5. For purposes of description, a 64-bit trimming code EN[0:63] and its complementary trimming code ENB[0:63] are used here as an example, where EN[0] and ENB[0] denote the most significant bits (MSB), and EN[63] and ENB[63] denote the least significant bits (LSB). Additionally, the trimming code EN[0:63] includes a coarse tune code EN[0:7] and a fine tune code EN[8:63], while the trimming code ENB[0:63] includes a coarse tune code ENB[0:7] and a fine tune code ENB[8:63].

In some embodiments, the driving circuit 510A includes inverters 501 to 503 and transistors Q1 to Q4. The input clock signal CK_IN is transmitted to node N1 through inverter 501. The fine tune circuit 511 is coupled between a power supply voltage VDD and transistor Q1. The fine tune circuit 511 includes a plurality of P-type transistors MP, each receiving a respective bit of the fine tune code ENB[8:63]. Accordingly, the fine tune circuit 511 provides a voltage signal vca1 to the source terminal of transistor Q1. The fine tune circuit 512 is coupled between a reference voltage VSS and transistor Q2. The fine tune circuit 512 includes a plurality of N-type transistors MN, each receiving a respective bit of the fine tune code EN[8:63]. Accordingly, the fine tune circuit 512 provides a voltage signal vcb1 at the source terminal of transistor Q2.

In some embodiments, transistors Q3 and Q4 form an inverter, and the voltage signal generated at node N1 is sent to gate terminals of transistor Q3 and Q4. The voltage signal FB (e.g., a feedback signal) generated at node N2 is sent to inverter 502, and fed back to gate terminal of transistors Q1 and Q2. The coarse tune circuit 521 and the auxiliary coarse tune circuit 531 are coupled between the power supply voltage VDD and transistor Q3. The coarse tune circuit 521 includes a plurality of P-type transistors MP0 to MP7, each receiving a respective of the coarse tune code ENB[0:7]. It should be noted that the width of each P-type transistor MP0 to MP7 within the coarse tune circuit 521 is relatively larger than that of each P-type transistor MP within the fine tune circuit 511. Accordingly, each bit of the coarse tune code ENB[0:7] received by each P-type transistor MP0 to MP7 (e.g., each with gain factor $\beta_p$) within the coarse tune circuit 521 may represent a respective piecewise linear curve for adjusting the duty cycle of the output clock signal CK_OUT.

In some embodiments, the coarse tune circuit 522 and the auxiliary coarse tune circuit 532 are coupled between the reference voltage VSS and transistor Q4. The coarse tune circuit 522 includes a plurality of N-type transistors MN1 to MN7, each receiving a respective of the coarse tune code EN[0:7]. It should be noted that the width of each N-type transistor MN0 to MN7 within the coarse tune circuit 522 is relatively larger than that of each N-type transistor MN within the fine tune circuit 512. In some embodiments, the driving capability of each N-type transistor MN0 to MN7 within the coarse tune circuit 522 is substantially the same as that of each P-type transistor MP0 to MP7 within the coarse tune circuit 521. Accordingly, each bit of the coarse tune code EN[0:7] received by each N-type transistor MN0 to MN7 (e.g., each with gain factor $\beta_n$) within the coarse tune circuit 522 may represent a respective piecewise linear curve for adjusting the duty cycle of the output clock signal CK_OUT.

In some embodiments, the auxiliary coarse tune circuit 531 includes a plurality of P-type transistors MP10 to MP17, each receiving a respective bit of an auxiliary coarse tune code ACB[0:7]. Additionally, given that the P-type transistors MP0 to MP7 within the coarse tune circuit 521 have respective transistor gain factors $\beta_{p0}$ to $\beta_{p7}$, the P-type transistors MP10 to MP17 within the auxiliary coarse tune circuit 531 have respective transistor gain factors $\beta_{p0}/2$ to $\beta_{p6}/2$. In some embodiments, the P-type transistors MP0 to MP7 and MP10 to MP17 are fabricated in the same process. Thus, the P-type transistors MP0 to MP7 are substantially identical with equal transistor gain factors $\beta_p$. Similarly, the P-type transistors MP11 to MP17 are substantially identical with equal transistor gain factors $\beta_p/2$, indicating that the width of each P-type transistor MP10 to MP17 is half that of each P-type transistor MP0 to MP7.

In some embodiments, the auxiliary coarse tune circuit 532 includes a plurality of N-type transistors MN11 to MN17, each receiving a respective of the coarse tune code EN[0:7]. Additionally, given that the N-type transistors MN1 to MN7 within the coarse tune circuit 522 have respective transistor gain factors $\beta_{n1}$ to $\beta_{n7}$, the N-type transistors MN11 to MN17 within the auxiliary coarse tune circuit 532 have respective transistor gain factors $\beta_{n1}/2$ to $\beta_{n7}/2$. In some embodiments, the N-type transistors MN1 to MN7 and MN11 to MN17 are fabricated in the same process. Thus, the N-type transistors MN1 to MN7 are substantially identical with equal transistor gain factors $\beta_n$. Similarly, the N-type transistors MN11 to MN17 are substantially identical with equal transistor gain factors $\beta_n/2$, indicating that the width of each N-type transistor MN11 to MN17 is half that of each N-type transistor MN1 to MN7.

Specifically, the P-type transistors MP0 to MP7 within the coarse tune circuit 521 can operate in conjunction with the N-type transistors MN0 to MN7 within the coarse tune circuit 522. Each bit of the coarse tune codes ENB[0:7] and EN[0:7] can constitute a step of the duty cycle of the intermediate clock signal FB and the output clock signal CK_OUT. Additionally, each P-type transistor MP10 to MP17 within the auxiliary coarse tune circuit 531 have half gain factor $\beta_p/2$, while each N-type transistor MN10 to MN17 within the auxiliary coarse tune circuit 532 have half gain factor $\beta_n/2$. Accordingly, a valid bit (e.g., 0) of the auxiliary coarse tune code ACB[0:7] received by one of the P-type transistor MP10 to MP17 and a valid bit (e.g., 1) of the auxiliary coarse tune code AC[0:7] received by one of the N-type transistors MN10 to MN17 can constitute a half step of the duty cycle of the intermediate clock signal FB and the output clock signal CK_OUT. Accordingly, the coarse tune circuit 521 operates in conjunction with the auxiliary tune circuit 531 to provide a voltage signal vca2 to the source terminal of transistor Q3, while the coarse tune circuit 522 operates in conjunction with the auxiliary tune circuit 532 to provide a voltage signal vcb2 to the source terminal of transistor Q4, thereby implementing a finer coarse tune step for adjusting the duty cycle of the intermediate clock signal FB and the output clock signal CK_OUT. The intermediate clock signal FB passes through inverters 502 and 503 to obtain the output clock signal CK_OUT.

In some embodiments, code1 and code2 obtained from the calibration procedure shown in FIG. 2 may have respective coarse tune codes C1 and C2 and fine tune codes F1 and F2. The average coarse tune code avg(C1,C2) and the average fine tune code avg(F1, F2) can be expressed as (C1+C2)/2 and (F1+F2)/2, respectively. It should be noted that each of the coarse tune codes C1 and C2 and fine tune codes F1 and F2 is a natural number (e.g., an integer equal to or larger than 0), indicating that the average coarse tune code avg(C1, C2) could be an integer or a fractional number with a fraction part of 0.5. Similarly, the average fine tune code avg(F1, F2) could also be an integer or a fractional number with a fraction part of 0.5.

In some embodiments, as depicted in FIG. 6, curves 602 and 604 represent different piecewise linear curves, and curve 606 represents an auxiliary piecewise linear curve. Curve 602 ranges between trim codes of 11 (point P13) and 19, while curve 604 ranges between trim codes of 1 and 9 (point P12). Points P15 and P14 on curve 602 correspond to the target duty cycle (DC) and the second duty cycle (DC2). Points P11 and P17 on curve 604 correspond to the first duty cycle (DC1) and the target DC. Additionally, point P16 on curve 606 corresponds to the target DC. In some embodiments, the target DC may be the average of duty cycles DC1 and DC2, achieving auto-zeroing of the dynamic offset calibration system 10.

For purposes of description, Code1=(C1, F1)=(1, 3) and Code2=(C2, F2)=(2, 8). Since C1=1 and C2=2, it indicates that Code1 and Code2 are located on different piecewise linear curves 602 and 604. Additionally, the auto-zeroed trim code transmitted from the finite state machine 118 to the first corrector circuit 100A or the second corrector circuit 100B may include three portions, such as a coarse tune code, an auxiliary coarse tune code, and a fine tune code. The coarse tune code refers to the average coarse tune code avg(C1, C2), while the fine tune code refers to the average fine tune code avg(F1, F2). Additionally, a bit of the auxiliary coarse tune code is asserted when the average coarse tune code avg(C1, C2) is a fractional number with a fraction part of 0.5.

In some embodiments, when the average coarse tune code avg(C1, C2) is an integer, all bits within the auxiliary coarse code AC[0:7] are 1, indicating that all bits within the complementary auxiliary coarse code ACB[0:7] are 0. When the average coarse tune code avg(C1, C2) is a fractional number with a fraction part of 0.5, a respective bit within the auxiliary coarse code AC[0:7] is 1, while the other bits within the auxiliary coarse code AC[0:7] are 0.

For example, the coarse tune codes EN[0:7] and ENB[0:7] and fine tune codes EN[8:63] and ENB[8:63] are expressed using thermal meter codes. The average coarse tune code avg(C1, C2) can be calculated as avg(C1, C2)=(1+2)/2=1.5, which is a fractional number with an integer part of 1 and a fraction part of 0.5. Thus, the first bit EN[0] of the coarse tune code EN[0:7] is 1 and the other bits of the coarse tune code EN[0:7] are 0, turning on transistor MN0. Similarly, the first bit ENB[0] of the coarse tune code ENB[0:7] is 0, and the other bits of the coarse tune code ENB[0:7] are 1, turning on transistor MP0. Additionally, the second bit AC[1] of the auxiliary coarse tune code AC[0:7] is 1 and the other bits of the auxiliary coarse code AC[0:7] are 0, turning on transistor MN11. Similarly, the second bit ACB[1] of the auxiliary coarse tune code ACB[0:7] is 0 and the other bits of the auxiliary coarse code AC[0:7] are 1, turning on transistor MP11. At this time, the calibration of the duty cycle of the output clock signal CK_OUT can be performed on curve 606, which is an auxiliary piecewise linear curve between curves 602 and 604, thereby providing a higher coarse tune resolution for calibrating the duty cycle of the output clock signal CK_OUT. Additionally, the average fine tune code avg(F1, F2) can be calculated as avg(F1, F2)=(3+8)/2=5.5, which is a fractional number with an integer part of 5 and a fractional part of 0.5. Thus, the first five bits EN[8:12] of the fine tune code EN[8:63] are all 1, while the other bits of the fine tune code EN[8:63] are 0, turning on five N-type transistors MN. Similarly, the first five bits ENB[8:12] of the fine tune code ENB[8:63] are all 0, while the other bits of the fine tune code ENB[8:63] are 1, turning on five P-type transistors MP. Therefore, the fine tuning of the duty cycle of the intermediate clock signal FB and the output clock signal CK_OUT can be performed on curve 606, thereby providing a more precise duty cycle of the output clock signal CK_OUT.

Figure 7:
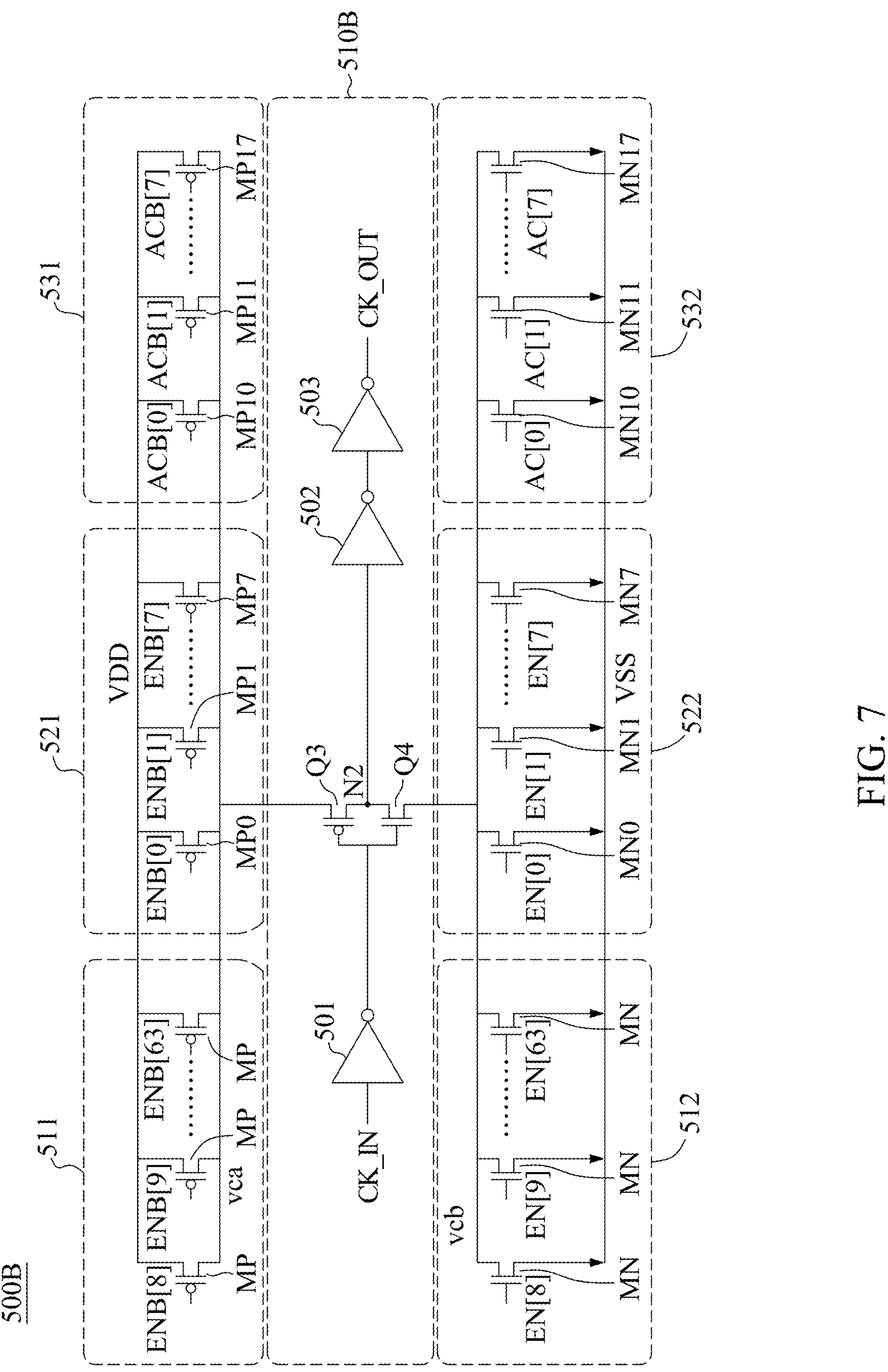
FIG. 7 is a schematic diagram of a corrector circuit in accordance with still some embodiments of the present disclosure.

FIG. 7 is a schematic diagram of a corrector circuit in accordance with still some embodiments of the present disclosure.

In some embodiments, the first corrector circuit 100A and the second corrector circuit 100B shown in FIG. 1 can be implemented using the corrector circuit 500B shown in FIG. 7. When the input clock signal CK_IN refers to the in-phase clock signal CKI_IN, the output clock signal CK_OUT refers to the in-phase output clock signal CKI_OUT. Similarly, when the input clock signal CK_IN refers to the quadrature clock signal CKQ_IN, the output clock signal CK_OUT refers to the quadrature output clock signal CKQ_OUT. The corrector circuit 500B shown in FIG. 7 is similar to the corrector circuit 500A shown in FIG. 5, with the difference being that (a) transistors Q1 and Q2 are omitted from the driving circuit 510B; (b) the fine tune circuit 511, coarse tune circuit 521, and auxiliary coarse tune circuit 531 are coupled between the power supply voltage VDD and transistor Q3; and (c) the fine tune circuit 512, coarse tune circuit 522, and auxiliary coarse tune circuit 532 are coupled between the reference voltage VSS and transistor Q4. The operations of the corrector circuit 500B shown in FIG. 7 are similar to those of the corrector circuit 500A shown in FIG. 5, and thus the details thereof are not repeated here.

Figure 8:
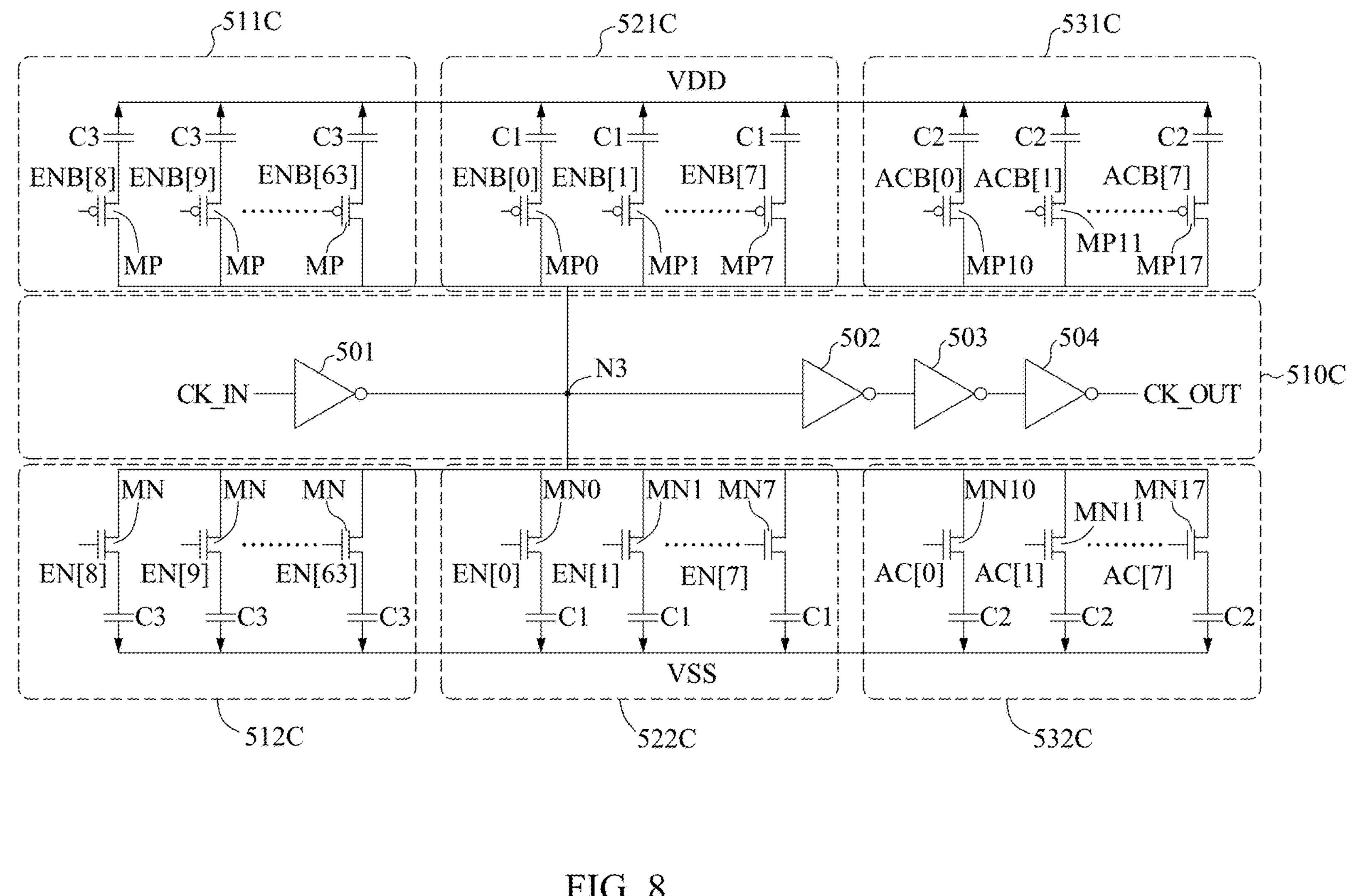
FIG. 8 is a schematic diagram of a corrector circuit in accordance with still some embodiments of the present disclosure.

FIG. 8 is a schematic diagram of a corrector circuit in accordance with still some embodiments of the present disclosure.

In some embodiments, the first corrector circuit 100A and the second corrector circuit 100B shown in FIG. 1 can be implemented using the corrector circuit 500C shown in FIG. 8. When the input clock signal CK_IN refers to the in-phase clock signal CKI_IN, the output clock signal CK_OUT refers to the in-phase output clock signal CKI_OUT. Similarly, when the input clock signal CK_IN refers to the quadrature clock signal CKQ_IN, the output clock signal CK_OUT refers to the quadrature output clock signal CKQ_OUT. The corrector circuit 500C shown in FIG. 8 is similar to the corrector circuit 500A shown in FIG. 5, with the difference being that (a) transistors Q1 to Q4 are omitted from the driving circuit 510C; (b) the driving circuit 510C further includes an inverter 504; (c) P-type transistors within the fine tune circuit 511C, coarse tune circuit 521C, and auxiliary coarse tune circuit 531C are coupled between the power supply voltage VDD and node N3 (e.g., an output terminal of inverter 501) through respective capacitors C1, C2, and C3; and (d) the fine tune circuit 512C, coarse tune circuit 522C, and auxiliary coarse tune circuit 532C are coupled between the reference voltage VSS and node N3 through respective capacitors C1, C2, and C3. Additionally, the capacitance value of capacitors C1 is relatively larger than that of capacitors C3, allowing the coarse tune circuit 521C and 522C to have a larger RC loading to adjust the duty cycle of the output clock signal CK_OUT in a larger step (e.g., coarse tune). The operations of the corrector circuit 500C shown in FIG. 8 are similar to those of the corrector circuit 500A shown in FIG. 5, and thus the details thereof are not repeated here.

Figure 9:
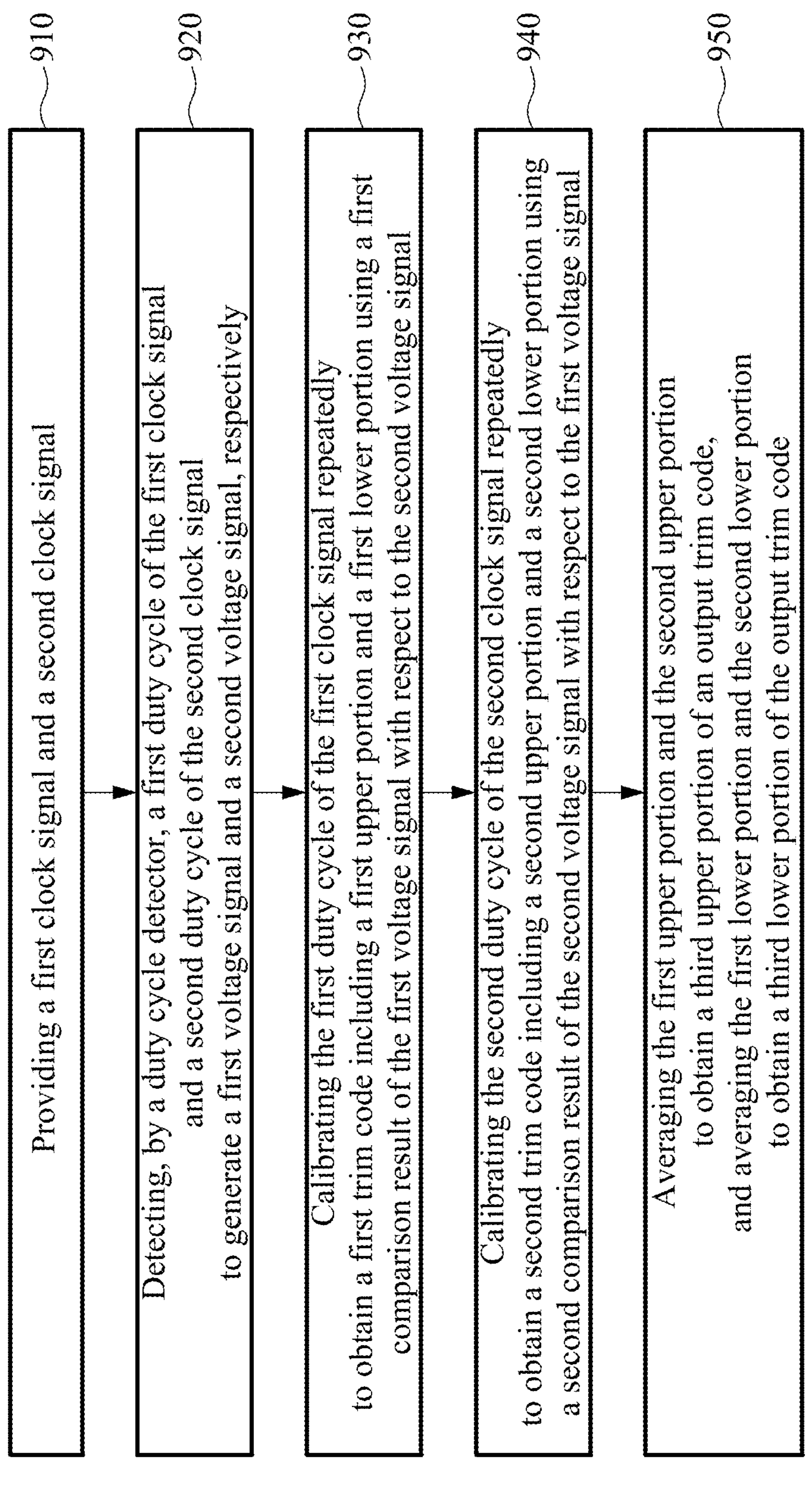
FIG. 9 is a flowchart of a method for operating a dynamic offset calibration system in accordance with some embodiments of the present disclosure.

FIG. 9 is a flowchart of a method for operating a dynamic offset calibration system in accordance with some embodiments of the present disclosure. The method 900 includes operations 910 to 950.

At operation 910, a first clock signal and a second clock signal are provided. In some embodiments, the first clock signal may be an in-phase clock signal CKI_IN, and the second clock signal may be a quadrature phase clock signal CKQ_IN. The first clock signal and the second clock signal may have a phase difference of 90 degrees.

At operation 920, a first duty cycle of the first clock signal and a second duty cycle of the second clock signal are detected by a duty cycle detector to generate a first voltage signal and a second voltage signal, respectively. In some embodiments, the duty cycle detector 108 is configured to detect duty cycles of the output clock signals CKI_OUT and CKQ_OUT generated by the first corrector circuit 100A and the second corrector circuit 100B to generate a first voltage signal V1 and a second voltage signal V2, respectively.

At operation 930, the first duty cycle of the first clock signal is calibrated to obtain a first trim code including a first upper portion and a first lower portion using a first comparison result of the first voltage signal with respect to the second voltage signal. In some embodiments, the first trim code may refer to code1 of the output clock signal CKI_OUT, and the first upper portion and the first lower portion of the first trim code refers to the coarse tune code and the fine tune code of code1, respectively.

At operation 940, the second duty cycle of the second clock signal is calibrated to obtain a second trim code including a second upper portion and a second lower portion using a second comparison result of the second voltage signal with respect to the first voltage signal. In some embodiments, the second trim code may refer to code2 of the output clock signal CKQ_OUT, and the second upper portion and the second lower portion of the second trim code refers to the coarse tune code and the fine tune code of code2, respectively.

At operation 950, the first upper portion and the second upper portion are averaged to obtain a third upper portion of an output trim code, and the first lower portion and the second lower portion are averaged to obtain a third lower portion of the output trim code. In some embodiments, in order to obtain correct average trim code on piecewise linear curves, the first upper portion and the second upper portion are averaged to obtain a third upper portion (e.g., coarse tune code) of the output trim code, while the first lower portion and the second lower portion are averaged to obtain the third lower portion (e.g., fine tune code) of the output trim code.

An aspect of the present disclosure provides an integrated circuit which includes a first corrector circuit and a second corrector circuit. The first corrector circuit is configured to receive a first clock signal and calibrate a first duty cycle of the first clock signal based on an offset calibration code to generate a first output clock signal. The second corrector circuit is configured to receive a second clock signal and calibrate a second duty cycle of the second clock signal based on the offset calibration code to generate a second output clock signal. The offset calibration code is obtained based on a first trim code associated with the first output clock signal and a second trim code associated with the second output clock signal. The first trim code includes a first upper portion and a first lower portion, and the second trim code includes a second upper portion and a second lower portion. A first portion of the offset calibration code is an average of the first upper portion and the second upper portion, and a second portion of the offset calibration code is an average of the first lower portion and the second lower portion.

Another aspect of the present disclosure provides an integrated circuit which includes a first corrector circuit and a second corrector circuit. The first corrector circuit is configured to receive a first clock signal and calibrate a first duty cycle of the first clock signal based on a first portion and a second portion of an offset calibration code to generate a first output clock signal. The second corrector circuit is configured to receive a second clock signal and calibrate a second duty cycle of the second clock signal based on the first portion and the second portion of the offset calibration code to generate a second output clock signal. Each bit of the first portion constitutes a first duty cycle difference to the first duty cycle and the second duty cycle, and each bit of the second portion constitutes a second duty cycle difference to the first duty cycle and the second duty cycle. The first duty cycle difference is relatively larger than the second duty cycle difference.

An aspect of the present disclosure provides a method. The method includes the following steps: providing a first clock signal and a second clock signal; detecting, by a duty cycle detector, a first duty cycle of the first clock signal and a second duty cycle of the second clock signal to generate a first voltage signal and a second voltage signal, respectively; calibrating the first duty cycle of the first clock signal repeatedly to obtain a first trim code including a first upper portion and a first lower portion using a first comparison result of the first voltage signal with respect to the second voltage signal; calibrating the second duty cycle of the second clock signal repeatedly to obtain a second trim code including a second upper portion and a second lower portion using a second comparison result of the second voltage signal with respect to the first voltage signal; and averaging the first upper portion and the second upper portion to obtain a third upper portion of an output trim code, and averaging the first lower portion and the second lower portion to obtain a third lower portion of the output trim code.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. An integrated circuit, comprising:

a first corrector circuit, configured to receive a first clock signal and calibrate a first duty cycle of the first clock signal based on an offset calibration code to generate a first output clock signal; and a second corrector circuit, configured to receive a second clock signal and calibrate a second duty cycle of the second clock signal based on the offset calibration code to generate a second output clock signal, wherein the offset calibration code is obtained based on a first trim code associated with the first output clock signal and a second trim code associated with the second output clock signal, wherein the first trim code comprises a first upper portion and a first lower portion, and the second trim code comprises a second upper portion and a second lower portion, wherein a first portion of the offset calibration code is an average of the first upper portion and the second upper portion, and a second portion of the offset calibration code is an average of the first lower portion and the second lower portion.

2. The integrated circuit of claim 1, wherein the first clock signal is an in-phase clock signal, and the second clock signal is a quadrature phase clock signal having a 90 degree phase difference with respect to the first clock signal.

3. The integrated circuit of claim 1, further comprising:

a duty cycle corrector, configured to convert the first duty cycle of the first output clock signal and the second duty cycle of the second output clock signal to a first voltage signal and a second voltage signal, respectively;

a chopper, configured to bypass the first voltage signal and the second voltage signal as a first chopped voltage signal and a second chopped voltage signal in a bypass mode;

a first low-pass filter, configured to filter the first chopped voltage signal to generate a first signal;

a second low-pass filter, configured to filter the second chopped voltage signal to generate a second signal;

a comparator, configured to generate a comparison result of the first signal with respect to the second signal; and a finite state machine, configured to change an operating state in response to the comparison result and generate a trim code corresponding to the operating state.

4. The integrated circuit of claim 3, wherein the chopper is configured to swap the first voltage signal and the second voltage signal to generate the first chopped voltage signal and the second chopped voltage signal in a swap mode.

5. The integrated circuit of claim 4, wherein in response to the comparison result being in a low logic state, the finite state machine increases the trim code by 1, and feeds the trim code back to the first corrector circuit until the comparison result is flipped from the low logic state to a high logic state.

6. The integrated circuit of claim 5, wherein in response to the comparison result flipping from the low logic state to the high logic state, the finite state machine records the trim code currently used as the first trim code, and the chopper enters the swap mode to swap the first voltage signal and the second voltage signal to generate the first chopped voltage signal and the second chopped voltage signal.

7. The integrated circuit of claim 6, wherein in response to the comparison result being in the high logic state, the finite state machine decreases the trim code by 1, and feeds the trim code back to the second corrector circuit until the comparison result is flipped from the high logic state to the low logic state.

8. The integrated circuit of claim 7, wherein in response to the comparison result flipping from the high logic state to the low logic state, the finite state machine records the trim code currently used as the second trim code.

9. The integrated circuit of claim 8, wherein the finite state machine extracts the first upper portion and the first lower portion of the first trim code, and extracts the second upper portion and the second lower portion of the second trim code.

10. The integrated circuit of claim 9, wherein each bit of the first portion and the second portion of the offset calibration code constitute a first duty cycle difference and a second duty cycle difference of the first output clock signal, respectively, and the first duty cycle difference is relatively larger than the second duty cycle difference.

11. The integrated circuit of claim 10, wherein in response to the first portion of the offset calibration code being a fractional number with an integer part and a fractional part, an auxiliary bit associated with the fractional part is asserted to constitute half the first duty cycle difference of the first output clock signal.

12. The integrated circuit of claim 11, wherein the first corrector circuit comprises:

a driving circuit, configured to receive the first clock signal to generate the first output clock signal;

a first upper tuning circuit, comprising a plurality of first P-type transistors, each receiving a respective bit of an inversed first portion of the offset calibration code;

a second upper tuning circuit, comprising a plurality of second P-type transistors, each receiving a respective bit of an inversed second portion of the offset calibration code;

a first lower tuning circuit, comprising a plurality of first N-type transistors, each receiving a respective bit of the first portion of the offset calibration code;

a second lower tuning circuit, comprising a plurality of second N-type transistors, each receiving a respective bit of the second portion of the offset calibration code;

an upper auxiliary tuning circuit, comprising a plurality of third P-type transistors, each receiving a respective bit of an inversed auxiliary first trim code; and a lower auxiliary tuning circuit, comprising a plurality of third N-type transistors, each receiving a respective bit of an auxiliary first trim code.

13. The integrated circuit of claim 12, wherein:

a driving capability of the first P-type transistors and the third P-type transistors is relatively higher than that of the second P-type transistors;

a driving capability of the first N-type transistors and the third N-type transistors is relatively higher than that of the second N-type transistors; and a driving capability of each of the P-type transistors and the third P-type transistors is substantially equal to that of each of the first N-type transistors and the third N-type transistors.

14. The integrated circuit of claim 12, wherein:

the driving circuit comprises a first inverter, a first driver, a second inverter, a third inverter, and a fourth inverter connected in series;

the first upper tuning circuit is coupled between a power supply voltage and the second inverter;

the second upper tuning circuit is coupled between the power supply voltage and the first driver;

the first lower tuning circuit is coupled between a reference voltage and the second inverter;

the second lower tuning circuit is coupled between the reference voltage and the first driver;

the upper auxiliary tuning circuit is coupled between the power supply voltage and the second inverter; and the lower auxiliary tuning circuit is coupled between the reference voltage and the second inverter.

15. An integrated circuit, comprising:

a first corrector circuit, configured to receive an in-phase clock signal and calibrate a first duty cycle of the in-phase clock signal based on a first portion and a second portion of an offset calibration code to generate a first output clock signal; and a second corrector circuit, configured to receive a quadrature phase clock signal and calibrate a second duty cycle of the quadrature phase clock signal based on the offset calibration code to generate a second output clock signal, wherein the quadrature phase clock signal has a 90-degree phase difference with respect to the in-phase clock signal, wherein the first portion of the offset calibration code is an average of a first upper portion of a first trim code and a second upper portion of a second trim code, wherein the second portion of the offset calibration code is an average of a first lower portion of the first trim code and a second lower portion of the second trim code, wherein the first trim code and the second trim code are associated with the in-phase clock signal and the quadrature phase clock signal, respectively.

16. The integrated circuit of claim 15, further comprising:

a duty cycle corrector, configured to convert the first duty cycle of the first output clock signal and the second duty cycle of the second output clock signal to a first voltage signal and a second voltage signal, respectively;

a chopper, configured to bypass the first voltage signal and the second voltage signal as a first chopped voltage signal and a second chopped voltage signal in a bypass mode;

a first low-pass filter, configured to filter the first chopped voltage signal to generate a first signal;

a second low-pass filter, configured to filter the second chopped voltage signal to generate a second signal;

a comparator, configured to generate a comparison result of the first signal with respect to the second signal; and a finite state machine, configured to change an operating state in response to the comparison result and generate a trim code corresponding to the operating state.

17. The integrated circuit of claim 16, wherein the chopper is configured to swap the first voltage signal and the second voltage signal to generate the first chopped voltage signal and the second chopped voltage signal in a swap mode.

18. The integrated circuit of claim 17, in response to the comparison result being in a low logic state, the finite state machine increases the trim code by 1, and feeds the trim code back to the first corrector circuit until the comparison result is flipped from the low logic state to a high logic state.

19. An integrated circuit, comprising:

a first corrector circuit, configured to receive a first clock signal and calibrate a first duty cycle of the first clock signal based on a first portion and a second portion of an offset calibration code to generate a first output clock signal; and a second corrector circuit, configured to receive a second clock signal and calibrate a second duty cycle of the second clock signal based on the first portion and the second portion of the offset calibration code to generate a second output clock signal, wherein the first portion of the offset calibration code is an average of a first most significant portion of a first trim code and a second most significant portion of a second trim code, wherein the second portion of the offset calibration code is an average of a first least significant portion of the first trim code and a second least significant portion of the second trim code, wherein the first trim code and the second trim code are associated with the first clock signal and the second clock signal, respectively.

20. The integrated circuit of claim 19, wherein the first clock signal is an in-phase clock signal, and the second clock signal is a quadrature phase clock signal having a 90 degree phase difference with respect to the first clock signal.

* * * * *